(12) United States Patent
Liao et al.

(10) Patent No.: US 12,368,543 B2
(45) Date of Patent: Jul. 22, 2025

(54) ELECTRONIC CIRCUIT AND METHOD FOR OPERATING THE SAME

(71) Applicant: TAIWAN SEMICONDUCTOR MANUFACTURING COMPANY LTD., Hsinchu (TW)

(72) Inventors: Chia-Chun Liao, Taipei (TW); Chao Chieh Li, Hsinchu (TW); Min-Shueh Yuan, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 11 days.

(21) Appl. No.: 18/344,902

(22) Filed: Jun. 30, 2023

(65) Prior Publication Data

US 2025/0007655 A1    Jan. 2, 2025

(51) Int. Cl.
*H04L 1/20* (2006.01)
*H03L 7/099* (2006.01)

(52) U.S. Cl.
CPC ............ *H04L 1/205* (2013.01); *H03L 7/0991* (2013.01)

(58) Field of Classification Search
CPC .............................. H04L 1/205; H03L 7/0991
See application file for complete search history.

(56) References Cited

U.S. PATENT DOCUMENTS 11,018,679 B1 * 5/2021 Jayakumar ............ H03L 7/0993

* cited by examiner

*Primary Examiner* — Rahel Guarino
(74) *Attorney, Agent, or Firm* — WPAT Law; Anthony King

(57) ABSTRACT

An electronic circuit and a method for operating the electronic circuit are provided. The electronic circuit includes a digital filter and a jitter optimization device. The digital filter is configured to receive a first signal and generate a second signal by filtering the first signal. The jitter optimization device is configured to receive the second signal and generate a first parameter and a second parameter according to the second signal. The jitter optimization device is configured to provide a first feature and a second feature associated with the second signal, and the first parameter and the second parameter are generated in response to the first feature or the second feature.

20 Claims, 7 Drawing Sheets

ELECTRONIC CIRCUIT AND METHOD FOR OPERATING THE SAME

BACKGROUND

The present disclosure relates, in general, to electronic circuits and methods for operating the same. Specifically, the present disclosure relates to electronic circuits with jitter optimization and methods for operating the same.

Accurate control of electrical features such as phase jitter or phase variation plays an important role. The phase jitter can be impacted by many factors such as digital-controlled oscillator (DCO) phase noise, time-to-digital converter (TDC) resolution, and loop bandwidth. However, the phase jitter may vary from one semiconductor die to another semiconductor die.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

Figure 1:
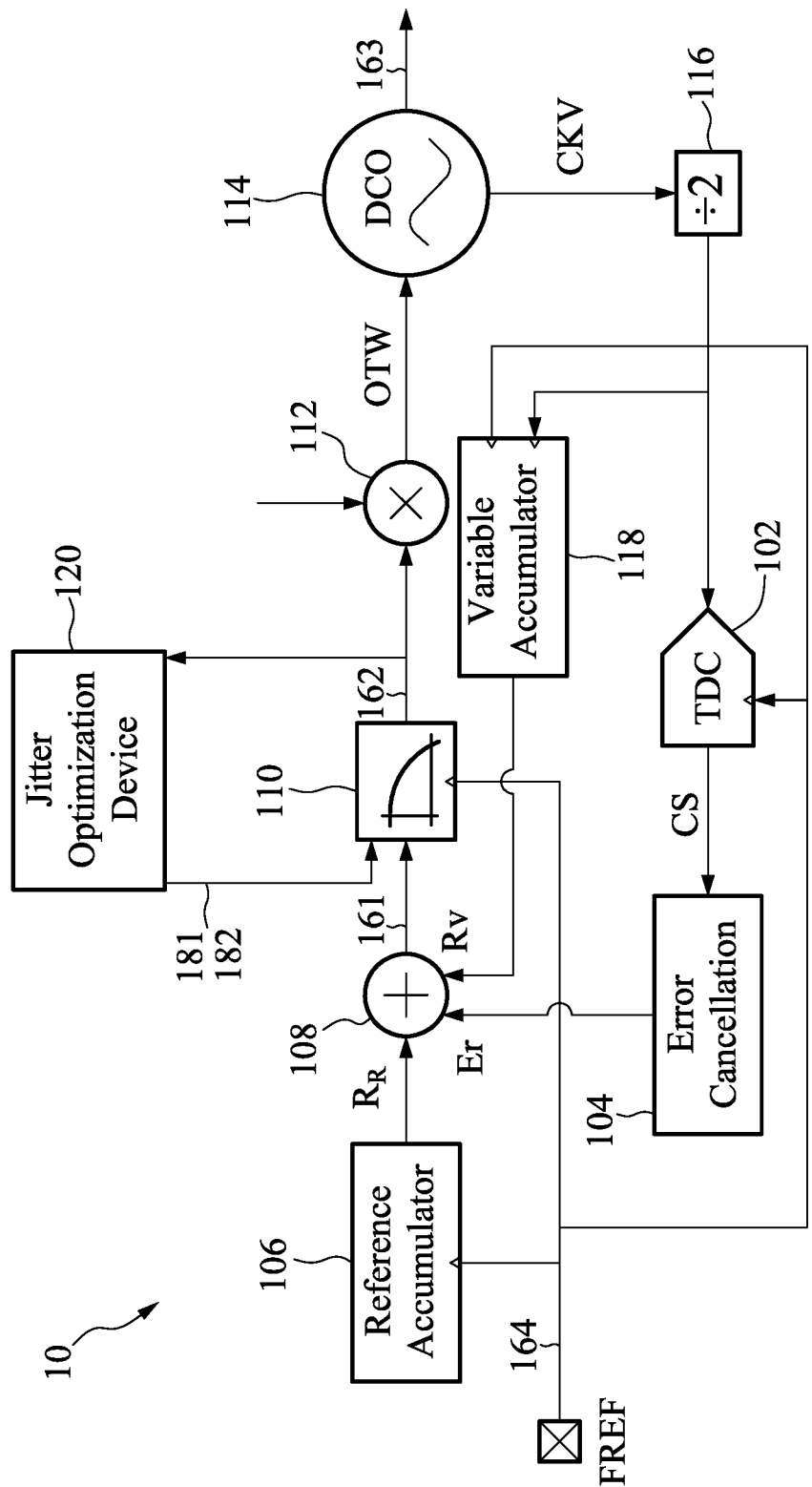
FIG. 1 is a schematic diagram of an electronic circuit, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic diagram of an electronic circuit 10, in accordance with some embodiments of the present disclosure. The electronic circuit 10 includes a time-to-digital converter (TDC) 102, an error cancellation circuit 104, a reference accumulator 106, an adder 108, a digital filter 110, a multiplier 112, a ring based digital-controlled oscillator (DCO) 114, a frequency divider 116, a variable accumulator 118, and a jitter optimization device 120.

Each of the variable accumulator 118, the reference accumulator 106, the TDC 102, and the digital filter 110 receives a signal 164. The signal 164 can include a loop reference frequency $f_{REF}$. The TDC 102 is configured to generate a converting signal CS in response to the loop reference frequency $f_{REF}$ of the signal 164. The error cancellation circuit 104 is configured to calculate and determine a majority of bit values of at least a portion of the converting signal CS to generate a phase error signal Er. The number of transitions within the phase error signal Er is less than the number of transitions within the converting signal CS.

In this case, the phase error signal Er from the error cancellation circuit 104, the accumulated variable error Rv from the variable accumulator 118, and the accumulated reference error $R_R$ from the reference accumulator 106 are all added by the adder 108 to generate the signal 161. The signal 161 can include a total phase error. The total phase error of the signal 161 can be electrically coupled to the input of the digital filter 110.

The digital filter 110 can be used to process or filter the signal 161 to generate the signal 162. The signal 162 can include the filtered phase error. The filtered phase error of the signal 162 transmitted from the output of the digital filter 110 can be provided to the multiplier 112. In addition, the signal 162 can be transmitted to the jitter optimization device 120 in order to generate two parameters 181 and 182. The digital filter 110 can be configured to receive the parameters 181 and 182 to reduce a phase jitter of the electronic circuit 10.

In some embodiments, the filtered phase error of the signal 162 can be multiplied by a normalization factor in the multiplier 112. Afterwards, an oscillator tuning word OTW can be generated accordingly and coupled to the input of the DCO 114 for providing the signal 163. The signal 163 can include an output frequency FOUT of the electronic circuit 10.

In some embodiments, the clock signal CKV can be generated by the DCO 114 in response to OTW. In this case, the normalization factor multiplied by the multiplier 112 is $f_{REF}/K_{DCO}$, where $K_{DCO}$ is a proportional constant for characterizing the specific DCO 114 and the number is the ratio between the reference oscillation signal and the loop reference frequency $f_{REF}$.

The various illustrative logical blocks, modules, devices and circuits described above in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

Figure 2:
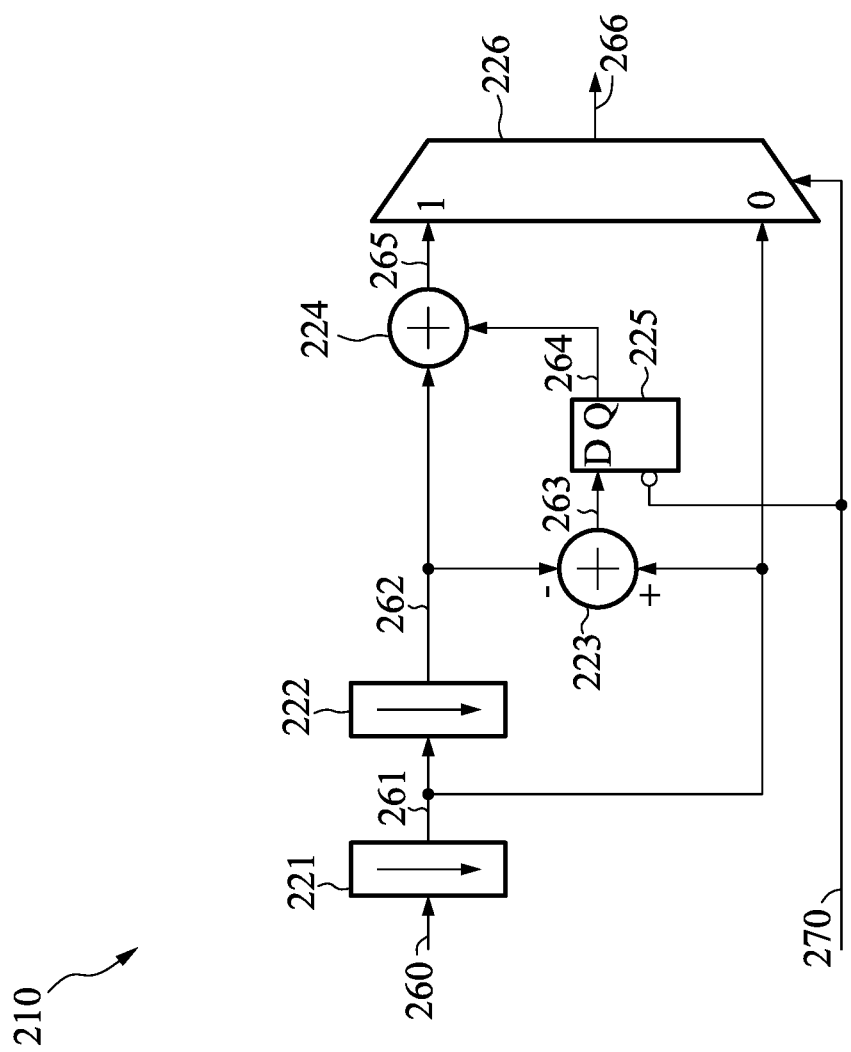
FIG. 2 is a schematic diagram of a digital filter of an electronic circuit, in accordance with some embodiments of the present disclosure.

FIG. 2 is a schematic diagram of a digital filter 210 of the electronic circuit, in accordance with some embodiments of the present disclosure. The digital filter 210 can correspond to the digital filter 110 of FIG. 1. The digital filter 210 can be included by the digital filter 110 of FIG. 1. The digital filter 210 can include a gear shifting function to prevent the electronic circuit 110 from being interfered with by abrupt variation of the parameters 181 and 182. The gear shifting function of the digital filter 210 can be performed as a background calibration to avoid affecting the normal operations of the electronic circuit 110.

The digital filter 210 can include two bit shifters 221 and 222, two adders 223 and 224, a flip-flop 225, and a multiplexer 226. The bit shifter 221 can receive the signal 260. The signal 260 can correspond to or be included by the signal 161 of FIG. 1. In some embodiments, the bit shifter 221 is configured to shift the signal 260 by a first parameter with a first value to generate the signal 261. The bit shifter 222 can receive the signal 261 from the bit shifter 221. In some embodiments, the bit shifter 222 is configured to shift the signal 261 by a first parameter with a difference between the first value and a second value to generate the signal 262. Therefore, compared to the signal 260, the signal 261 is shifted by a first parameter with the first value, and the signal 262 is shifted by a first parameter with the second value.

Afterwards, the signal 262 is transmitted to the adders 223 and 224. The adder 223 is configured to subtract the signal 262 from the signal 261 to generate the signal 263. The flip-flop 225 is configured to receive the signal 263 and a control signal 270 to generate the signal 264. The adder 224 is configured to add the signal 262 and the signal 264 to create a signal 265. The multiplexer 226 is configured to receive the signal 265 at a non-inverting input, receive the signal 261 at an inverting input, and receive the control signal 270 at a selection input. The signal 266 can therefore be generated by the multiplexer 226 in response to the signal 261, the signal 265 and the control signal 270. The signal 266 can correspond to or included by the signal 162 of FIG. 1.

Figure 3A:
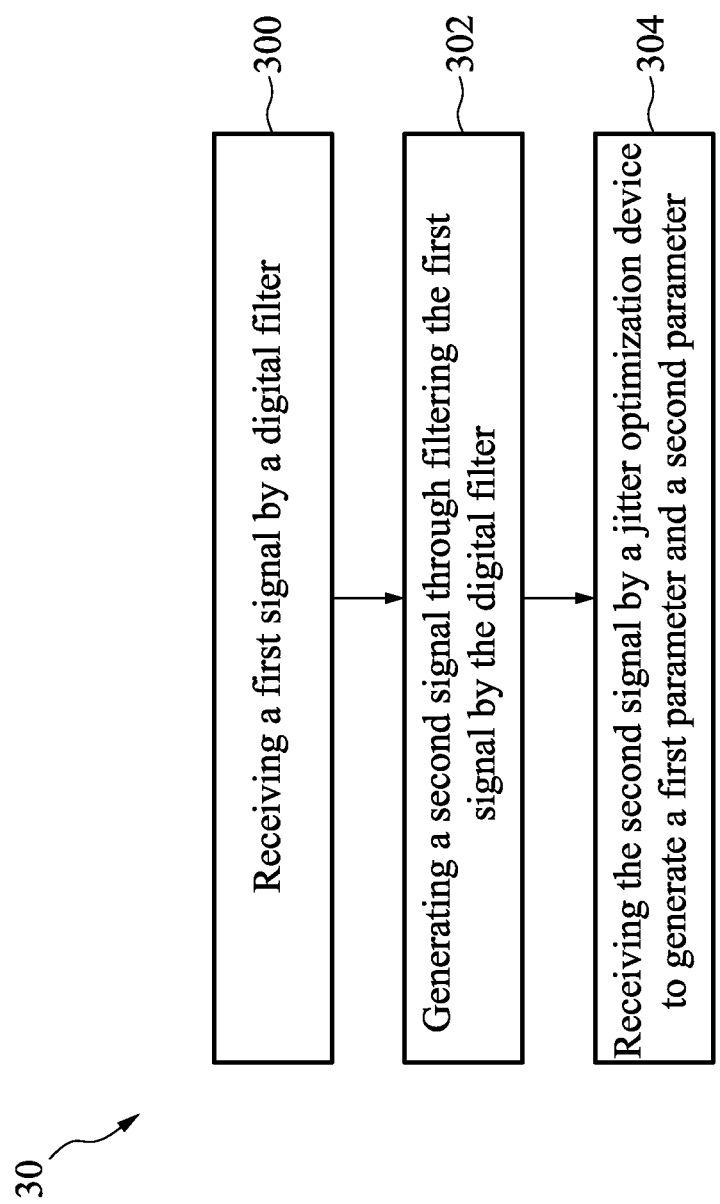
FIG. 3A illustrates a flow chart including operations for operating an electronic circuit, in accordance with some embodiments of the present disclosure.

FIG. 3A illustrates a flow chart 30 including operations 300 to 304 for operating an electronic circuit, in accordance with some embodiments of the present disclosure. In operation 300, a first signal is received by the digital filter 110. For example, the first signal can correspond to the signal 161 of FIG. 1. In operation 302, the digital filter 110 is configured to process or filter the first signal to generate a second signal. For example, the second signal can correspond to the signal 162 of FIG. 1.

In operation 304, the second signal can be received by the jitter optimization device 120 to generate a first parameter and a second parameter. In some embodiments, the first parameter can include an alpha (α) parameter. The first parameter can indicate or represent a bandwidth of the electronic circuit 10. The first parameter can be proportional to the bandwidth of the electronic circuit 10. In some embodiments, the second parameter can include a rho (ρ) parameter. The second parameter can indicate or represent the system stability, such as the phase margin or period margin, of the electronic circuit 10. The second parameter can be used to suggest certain ranges of the phase margin or the period margin in which the electronic circuit 10 can be operated with high stability or reliability. The operation 304 can include more operations, such as operations 3042 to 3048, which will be discussed below.

Figure 3B:
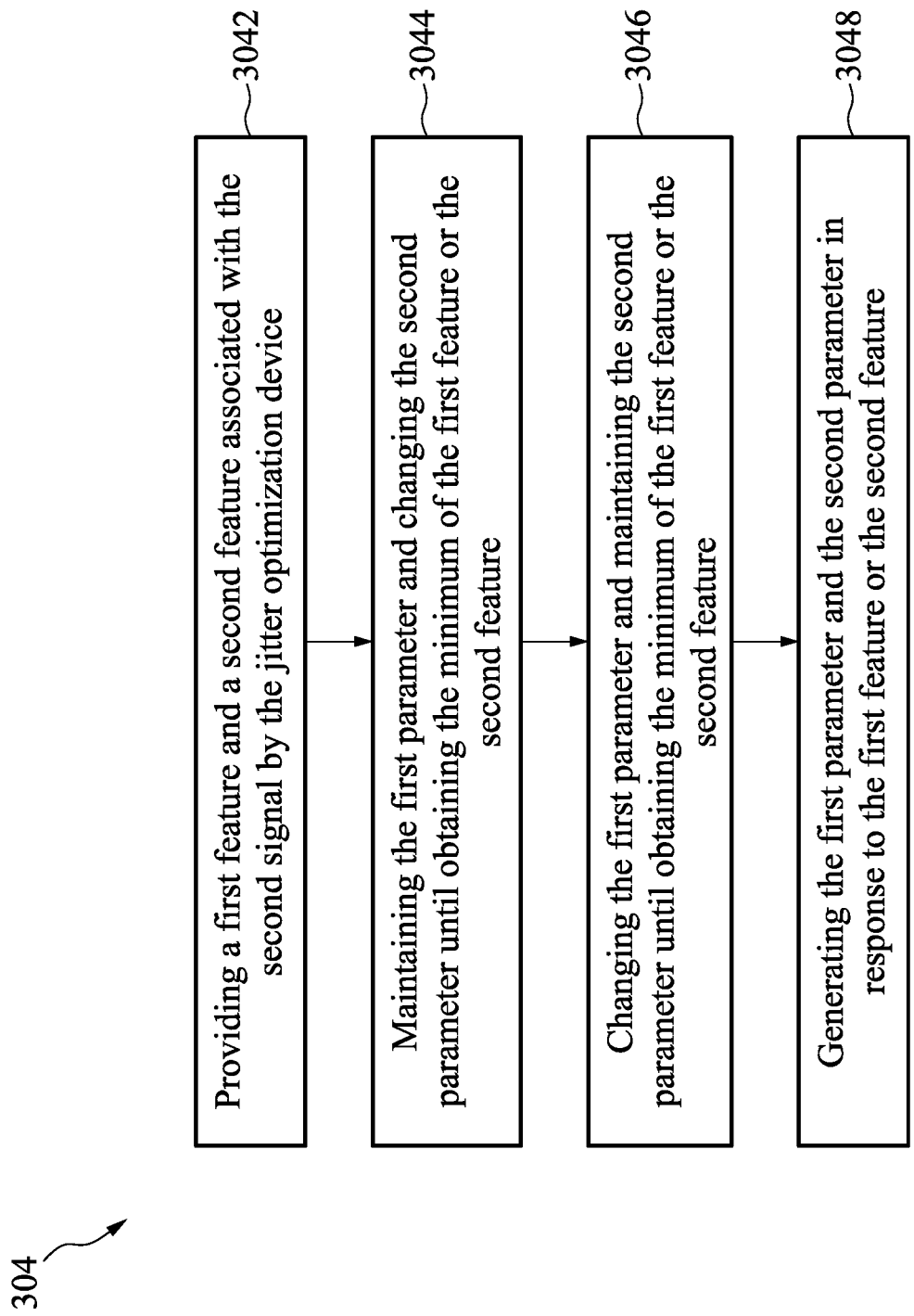
FIG. 3B illustrates a flow chart including operations for generating a first parameter and a second parameter by the jitter optimization device, in accordance with some embodiments of the present disclosure.

FIG. 3B illustrates a flow chart including operations 3042 to 3048 for generating the first parameter and the second parameter by the jitter optimization device 120, in accordance with some embodiments of the present disclosure. In operation 3042, the jitter optimization device 120 can provide a first feature and a second feature associated with or in response to the second signal. In some embodiments, the first parameter and the second parameter can be generated in response to or corresponding to the first feature or the second feature. In some embodiments, the first feature corresponds to a phase variation of the second signal, and the second feature corresponds to a period variation of the second signal.

In operation 3044, the jitter optimization device 120 can maintain the first parameter and change the second parameter continuously until obtaining the minimum of the first feature or the second feature. More specifically, the jitter optimization device 120 can sweep or increment the second parameter while keeping the first parameter constant in order to measure the first feature or the second feature. In operation 3046, the jitter optimization device 120 can maintain the second parameter and change the first parameter continuously until obtaining the minimum of the first feature or the second feature. More specifically, the jitter optimization device 120 can sweep or increment the first parameter while keeping the second parameter constant in order to measure the first feature or the second feature. In some embodiments, the operation 3046 can be performed before the operation 3044. In some embodiments, the operation 3044 and the operation 3046 can be executed repeatedly.

In operation 3048, the first parameter and the second parameter can be generated by the jitter optimization device 120 in response to the first feature or the second feature. The jitter optimization device 120 can determine the first parameter and the second parameter when the minimum of the first feature or the second feature is obtained. The jitter optimization device 120 can provide the first parameter and the second parameter through continuously processing the second signal and extracting the first feature and the second feature from the second signal. Therefore, the bandwidth optimization with phase jitter background calibration can be obtained to decrease the phase jitter variation. The bandwidth optimization with phase jitter background calibration can be achieved.

Figure 4:
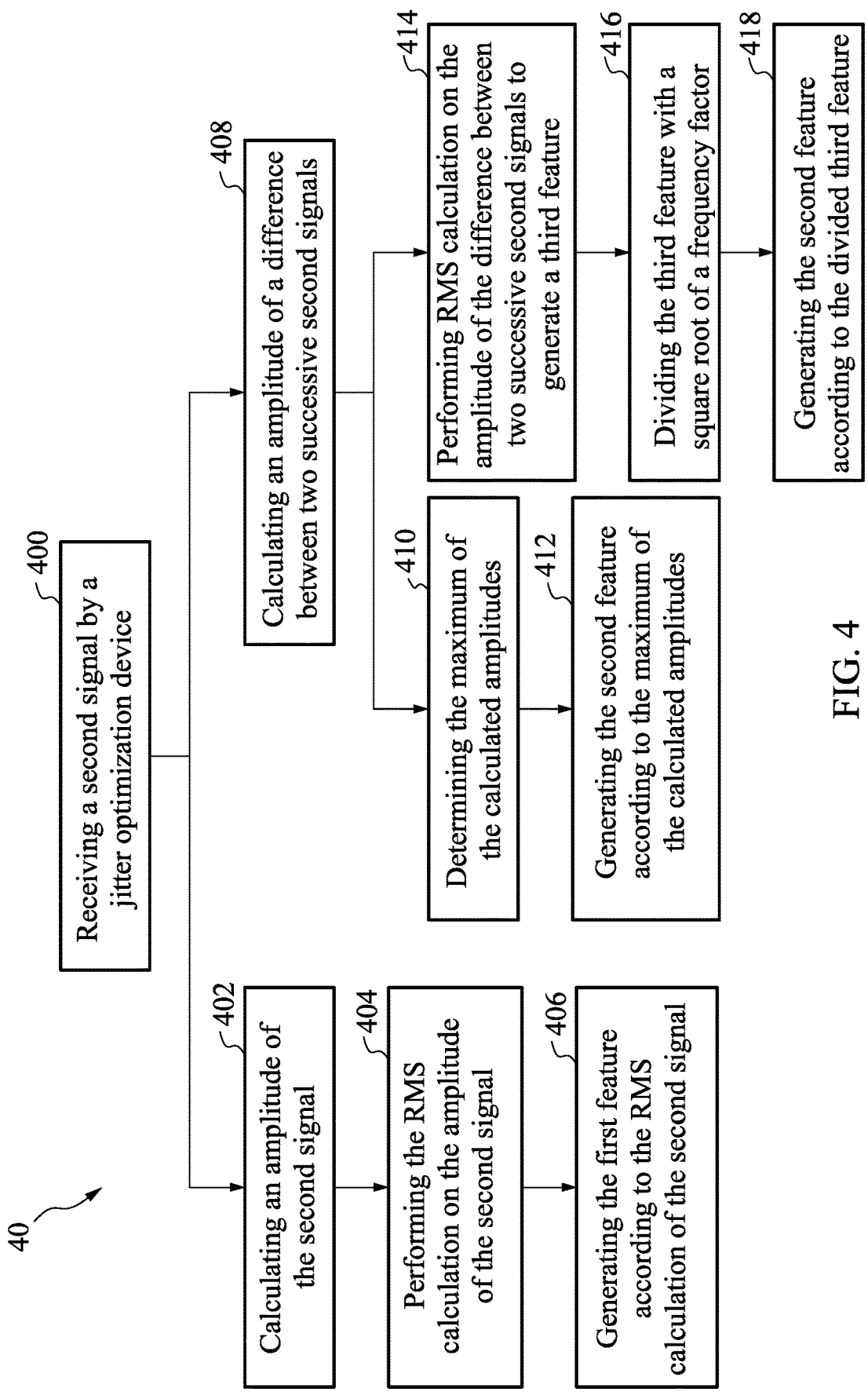
FIG. 4 illustrates a flow chart including operations for providing a first feature and a second feature by a jitter optimization device, in accordance with some embodiments of the present disclosure.

FIG. 4 illustrates a flow chart 40 including operations 400 to 418 for providing the first feature and the second feature by the jitter optimization device, in accordance with some embodiments of the present disclosure. In some embodiments, the operations 402 to 406 are performed to measure or determine the first feature, which can correspond to phase jitter or phase variation. In some embodiments, the operations 408 to 418 are performed to measure or determine the second feature, which can correspond to period jitter or period variation.

In operation 400, a second signal is received by the jitter optimization device 120. In some embodiments, the jitter optimization device 120 can continuously receive a plurality of second signals. In operation 402, the jitter optimization device 120 calculates the amplitude of the second signal. Specifically, the jitter optimization device 120 can calculate an absolute value of the second signal to determine its amplitude. In operation 404, the jitter optimization device 120 performs a root mean square (RMS) calculation on the amplitude of the second signal. In some embodiments, the jitter optimization device 120 can perform a first norm calculation, which means obtaining an average value on a plurality of successive values, on the amplitudes of the second signals. The amplitude of the second signal can be approximated by executing the RMS calculation or the first norm calculation. Performing the first norm calculation can reduce more hardware complexity than performing the RMS calculation. Afterwards, in operation 406, the first feature can be generated according to the RMS calculation or approximation of the second signal.

In operation 408, the jitter optimization device 120 calculates the amplitude of a difference between two successive second signals. The jitter optimization device 120 can calculate the amplitude of a difference between the second signal and another second signal successive to the second signal. In operation 410, the jitter optimization device 120 compares the calculated amplitudes and determines the maximum of the calculated amplitudes. Afterwards, in operation 412, the second feature can be generated according to the maximum of the calculated amplitudes of the second signals.

In some embodiments, another method for creating the second feature can be provided as shown in the operations 414 to 418. The operation 414 can be executed after performing the operation 408. In operation 414, the jitter optimization device 120 performs the RMS calculation on the amplitude of the difference between two successive second signals to generate a third feature. In some embodiments, the jitter optimization device 120 can execute the RMS calculation on the amplitude of the difference between the second signal and another second signal successive to the second signal to generate the third feature. In some embodiments, the amplitude of the difference between two successive second signals can be approximated by executing the first norm calculation to reduce hardware complexity and save manufacturing cost of the electronic circuit 10.

In operation 416, the jitter optimization device 120 can divide the third feature with a square root of a frequency factor of the electronic circuit 10. In some embodiments, the frequency factor can be defined as a ratio between the signal 163 and the signal 164. In operation 418, the second feature can be generated according to the divided third feature.

Based on the foregoing, the bandwidth optimization with phase jitter background calibration can be obtained to decrease the phase jitter variation and the period jitter variation. In addition, the alpha parameter and the rho parameter could be changed immediately without affect or glitch of phase error and frequency error by the proposed gear shifting function. Therefore, the bandwidth optimization with phase jitter background calibration can be achieved.

Figure 5:
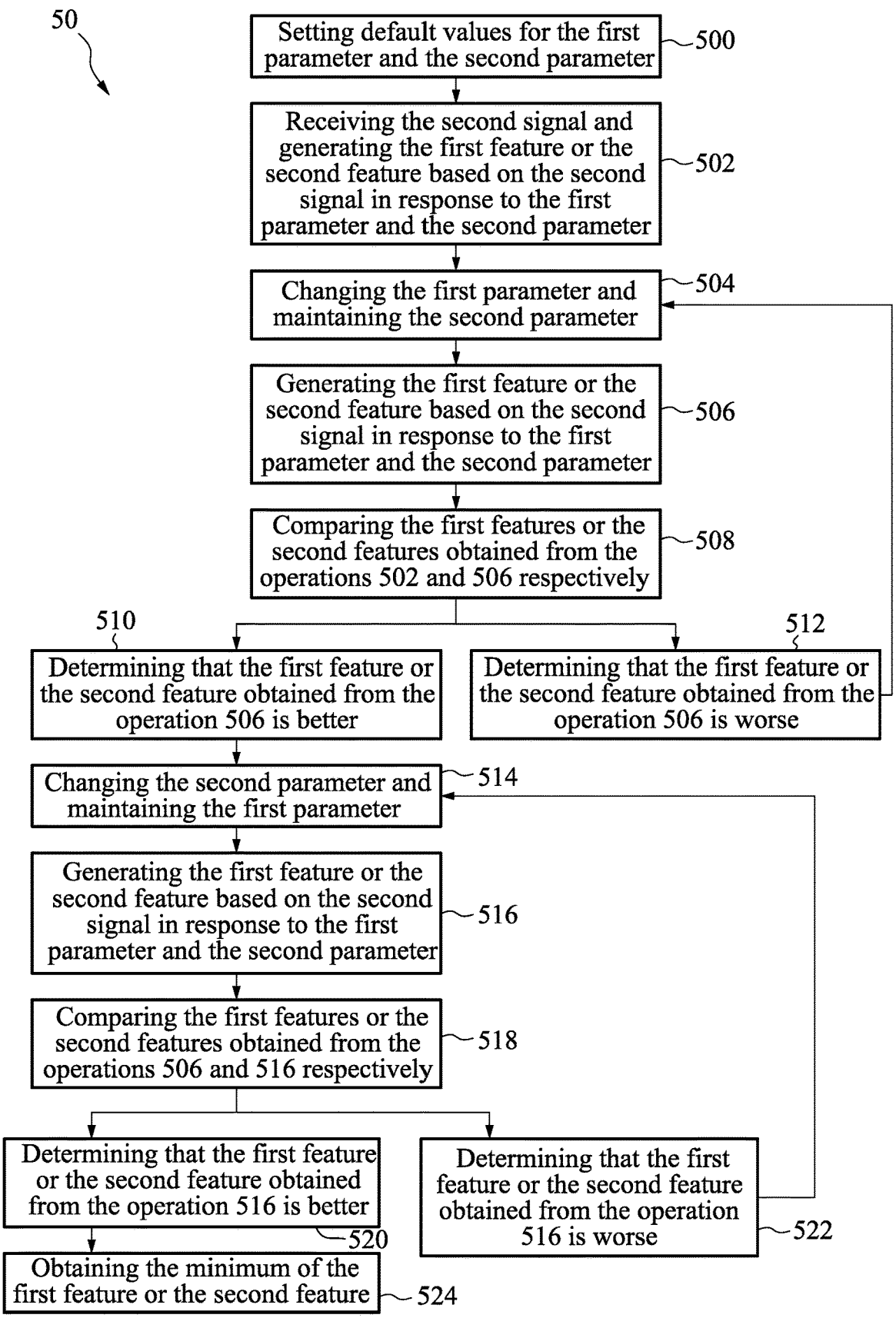
FIG. 5 illustrates a flow chart including operations of continuously processing a second signal by a jitter optimization device, in accordance with some embodiments of the present disclosure.

FIG. 5 illustrates a flow chart 50 including operations 500 to 514 of continuously processing the second signal by the jitter optimization device, in accordance with some embodiments of the present disclosure. In operation 500, the jitter optimization device 120 can set or determine default values for the first parameter and the second parameter. For example, the first parameter is initially set to be 3, and the second parameter is initially set to be 9. In operation 502, the jitter optimization device 120 can receive the second signal and generate the first feature or the second feature based on the second signal in response to the first parameter and the second parameter. For example, the jitter optimization device 120 processes or calculates the second signal in association with the first parameter as 3 and the second parameter as 9 to obtain the first feature or the second feature accordingly. The method of generating the first feature and the second feature are illustrated in FIG. 3 and FIG. 4. Therefore, some detailed descriptions may refer to the corresponding paragraphs here and are not repeated hereinafter for conciseness.

In operation 504, the jitter optimization device 120 changes the first parameter and maintains the second parameter. In some embodiments, the jitter optimization device 120 can keep the second parameter as 9 and increment the first parameter to be 4. In operation 506, the jitter optimization device 120 can generate the first feature or the second feature based on the second signal in response to the first parameter and the second parameter. For example, the jitter optimization device 120 processes or calculates the second signal in association with the first parameter as 4 and the second parameter as 9 to obtain the first feature or the second feature accordingly.

In operation 508, the jitter optimization device 120 compares the first features or the second features obtained from the operations 502 and 506 respectively. In some embodiments, if the first feature or the second feature obtained from the operation 506 is less than that from the operation 502, the operation 510 will be performed in which the jitter optimization device 120 determines that the first feature or the second feature obtained from the operation 506 is better. In some embodiments, if the first feature or the second feature obtained from the operation 506 is equal to or greater than that from the operation 502, the operation 512 will be performed in which the jitter optimization device 120 determines that the first feature or the second feature obtained from the operation 506 is worse. Afterwards, the operation 504 will be expected again to increment the first parameter and maintain the second parameter. For example, the first parameter can be increased from 4 to 5, while the second parameter is kept as 9.

In some embodiments, the operation 514 can be performed after the operation 510. In the operation 514, the jitter optimization device 120 changes the second parameter and maintains the first parameter. For example, the jitter optimization device 120 can keep the first parameter as 4 and increment the second parameter from 9 to 10. In operation 516, the jitter optimization device 120 can generate the first feature or the second feature based on the second signal in response to the first parameter and the second parameter. For example, the jitter optimization device 120 processes or calculates the second signal in association with the first parameter as 4 and the second parameter as 10 to obtain the first feature or the second feature accordingly. The method of generating the first feature and the second feature are illustrated in FIG. 3 and FIG. 4, and some detailed descriptions may refer to the corresponding paragraphs here and are not repeated hereinafter for conciseness.

In operation 518, the jitter optimization device 120 compares the first features or the second features obtained from the operations 506 and 516 respectively. In some embodiments, if the first feature or the second feature obtained from the operation 516 is less than that from the operation 506, the operation 520 will be performed in which the jitter optimization device 120 determines that the first feature or the second feature obtained from the operation 516 is better. Afterwards, in operation 524, the minimum of the first feature or the second feature can be obtained by the jitter optimization device 120. In this case, the first parameter and the second parameter can be determined by the jitter optimization device 120 based on the obtained of the minimum of the first feature or the second feature. The determined first parameter and the second parameter can be generated and provided by the jitter optimization device 120 to the digital filter 110.

In some embodiments, if the first feature or the second feature obtained from the operation 516 is equal to or greater than that from the operation 506, the operation 522 will be performed in which the jitter optimization device 120 determines that the first feature or the second feature obtained from the operation 516 is worse. Afterwards, the operation 514 will be expected again to increment the second parameter and maintain the first parameter. For example, the second parameter can be increased from 10 to 11, while the first parameter is still kept or maintained as 4.

By utilizing the proposed electronic circuit with jitter optimization and its operating method, the bandwidth optimization with phase jitter background calibration can be achieved to reduce the phase jitter variation among different semiconductor dies. The phase jitter could be improved as a minimum value by applying the proposed successive approximation of loop filter parameter such as the alpha parameter and the rho parameter. Nevertheless, the alpha parameter and the rho parameter could be changed immediately without affect or glitch of phase error and frequency error by the proposed gear shifting circuit. Therefore, the optimized loop bandwidth setting can be achieved to decrease phase jitter and improve the design margin.

While disclosed methods are illustrated and described below as a series of acts or events, it will be appreciated that the illustrated ordering of such acts or events are not to be interpreted in a limiting sense. For example, some operations may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
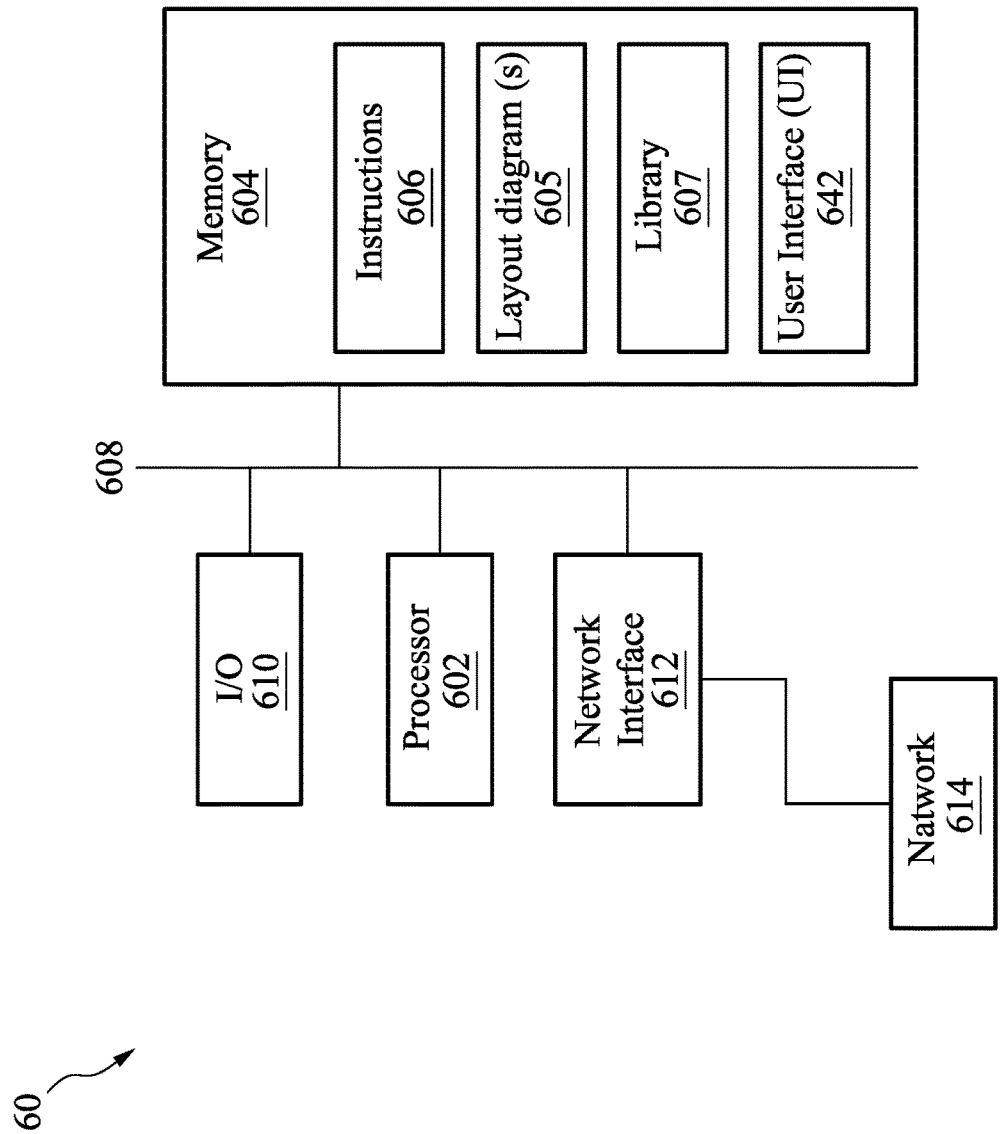
FIG. 6 is a block diagram of a system of operating and calibrating a semiconductor circuit, in accordance with some embodiments.

FIG. 6 is a block diagram of a system 60 of operating and calibrating a semiconductor circuit, in accordance with some embodiments. The system 60 can include, for example, an electronic design automation (EDA) system. In some embodiments, the system 60 includes an automatic placement and routing (APR) system. Methods described herein of operating and calibrating a semiconductor circuit, in accordance with one or more embodiments, are implementable, for example, using the system 60, in accordance with some embodiments.

In some embodiments, the system 60 is a general purpose computing device including a hardware processor 602 and a memory 604. The memory 604 may be a computer-readable storage medium. The storage medium, amongst other things, is encoded with computer program code or a set of executable instructions 606. Execution of instructions 606 by hardware processor 602 represents (at least in part) an EDA tool which implements a portion or all of a method according to an embodiment, e.g., the methods described herein in accordance with one or more embodiments (hereinafter, the noted processes and/or methods).

The processor 602 may be electrically coupled to the memory 604 (such as a computer-readable storage medium) via the bus 608. The processor 602 may be electrically coupled to an I/O interface 610 by bus 608. A network interface 612 may be electrically connected to processor 602 via bus 608. Network interface 612 may be connected to a network 614, so that processor 602 and the memory 604 are capable of connecting to external elements via network 614. Processor 602 may be configured to execute computer program code 606 encoded in memory 604 in order to cause system 60 to be usable for performing a portion or all of the noted processes and/or methods. In one or more embodiments, the processor 602 is a central processing unit (CPU), a multi-processor, a distributed processing system, an application specific integrated circuit (ASIC), and/or a suitable processing unit.

In one or more embodiments, the memory 604 may be an electronic, magnetic, optical, electromagnetic, infrared, and/or semiconductor system (or apparatus or device). For example, the memory 604 may include a semiconductor or solid-state memory, a magnetic tape, a removable computer diskette, a random access memory (RAM), a read-only memory (ROM), a rigid magnetic disk, and/or an optical disk. In one or more embodiments using optical disks, memory 604 includes a compact disk-read only memory (CD-ROM), a compact disk-read/write (CD-R/W), and/or a digital video disc (DVD).

In one or more embodiments, the memory 604 may store computer program code (instructions) 606 configured to cause system 60 (where such execution represents, at least in part, the EDA tool) to be usable for performing a portion or all of the noted processes and/or methods. In one or more embodiments, the memory 604 may store information which facilitates performing a portion or all of the noted processes and/or methods. In one or more embodiments, the memory 604 may store library 607 of standard cells including such standard cells as disclosed herein and one or more layout diagrams 605 such as those disclosed herein.

The system 60 may include I/O interface 610. I/O interface 610 may be coupled to external circuitry. In one or more embodiments, I/O interface 610 may include a keyboard, keypad, mouse, trackball, trackpad, touchscreen, and/or cursor direction keys for communicating information and commands to the processor 602.

The system 60 may include network interface 612 coupled to processor 602. Network interface 612 may allow system 60 to communicate with network 614, to which one or more other computer systems are connected. Network interface 612 may include wireless network interfaces such as BLUETOOTH, WIFI, WIMAX, GPRS, or WCDMA. Network interface 612 may include wired network interfaces such as ETHERNET, USB, or IEEE-1364. In one or more embodiments, a portion or all of the noted processes and/or methods, are implemented in two or more systems 60.

The system 60 may be configured to receive information through I/O interface 610. The information received through I/O interface 610 may include one or more of instructions, data, design rules, libraries of standard cells, and/or other parameters for processing by processor 602. The information may be transferred to processor 602 via the bus 608. System 60 may be configured to receive information related to a UI through I/O interface 610. The information may be stored in memory 604 as user interface (UI) 642.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods is implemented as a software application that is a portion of an EDA tool. In some embodiments, a portion or all of the noted processes and/or methods are implemented as a software application running on the system 60. In some embodiments, a layout diagram which includes standard cells is generated using a tool such as VIRTUOSO® available from CADENCE DESIGN SYSTEMS, Inc., or another suitable layout generating tool.

In some embodiments, the processor 602 is realized as functions of a program stored in a non-transitory computer readable recording medium. Examples of a non-transitory computer readable recording medium may include, but are not limited to, an external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Some embodiments of the present disclosure provide an electronic circuit. The electronic circuit includes a digital filter and a jitter optimization device. The digital filter is configured to receive a first signal and generate a second signal by filtering the first signal. The jitter optimization device is configured to receive the second signal and generate a first parameter and a second parameter according to the second signal. The jitter optimization device is configured to provide a first feature and a second feature associated with the second signal, and the first parameter and the second parameter are generated in response to the first feature or the second feature.

Some embodiments of the present disclosure provide an electronic circuit. The electronic circuit includes a digital filter and a jitter optimization device. The digital filter is configured to receive a first signal and filter the first signal to generate a second signal. The jitter optimization device is configured to receive the second signal and generate a first parameter and a second parameter by continuously processing the second signal, wherein the digital filter is configured to receive the first parameter and the second parameter and to reduce a phase jitter of the electronic circuit based on the first parameter and the second parameter.

Some embodiments of the present disclosure provide a method for operating an electronic circuit. The method includes: receiving a first signal by a digital filter; generating a second signal through filtering the first signal by the digital filter; and receiving the second signal, by a jitter optimization device, to generate a first parameter and a second parameter. The operation of generating the first parameter and the second parameter further includes: providing, by the jitter optimization device, a first feature and a second feature associated with the second signal; and generating the first parameter and the second parameter in response to the first feature or the second feature.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic circuit, comprising:
 a digital filter, configured to receive a first signal and generate a second signal by filtering the first signal; and
 a parameter generator, configured to receive the second signal and generate a first parameter and a second parameter according to the second signal, wherein the parameter generator is configured to provide a first feature and a second feature associated with the second signal, and the first parameter and the second parameter are generated in response to the first feature or the second feature.

2. The electronic circuit of claim 1, wherein the first feature corresponds to a phase variation of the second signal, and the second feature corresponds to a period variation of the second signal.

3. The electronic circuit of claim 2, wherein the first feature is calculated by performing a root mean square (RMS) calculation on an amplitude of the second signal.

4. The electronic circuit of claim 2, wherein the parameter generator is further configured to generate a third feature by executing an (RMS) calculation on an amplitude of a difference between the second signal and another second signal successive to the second signal.

5. The electronic circuit of claim 4, wherein the second feature is calculated by dividing the third feature with a square root of a frequency factor of the electronic circuit.

6. The electronic circuit of claim 1, wherein the parameter generator is further configured to continuously process the second signal until a minimum of the first feature or the second feature is obtained.

7. The electronic circuit of claim 6, wherein the parameter generator is further configured to continuously process the second signal by maintaining the first parameter and changing the second parameter until the minimum of the first feature or the second feature is obtained.

8. The electronic circuit of claim 7, wherein the parameter generator is further configured to continuously process the second signal by changing the first parameter and maintaining the second parameter until the minimum of the first feature or the second feature is obtained.

9. A electronic circuit, comprising:
a digital filter, configured to receive a first signal and filter the first signal to generate a second signal; and
a parameter generator, configured to receive the second signal and generate a first parameter and a second parameter by continuously processing the second signal, wherein the digital filter is configured to receive the first parameter and the second parameter and to reduce a phase jitter of the electronic circuit based on the first parameter and the second parameter.

10. The electronic circuit of claim 9, wherein the parameter generator is configured to extract a first feature and a second feature associated with the second signal, and the first parameter and the second parameter are created in response to the first feature or the second feature.

11. The electronic circuit of claim 10, wherein the digital filter comprises:
a first bit shifter, configured to shift the first signal by a first parameter with a first value to generate a first shift signal; and
a second bit shifter, configured to shift the first shift signal by a first parameter with a difference between the first value and a second value to generate a second shift signal.

12. The electronic circuit of claim 11, wherein the digital filter comprises:
a first adder, configured to subtract the second shift signal from the first shift signal to generate a third shift signal; and
a flip-flop, configured to receive the third shift signal and a control signal to generate a fourth shift signal.

13. The electronic circuit of claim 12, wherein the digital filter comprises:
a second adder, configured to add the second shift signal and the fourth shift signal to create a fifth shift signal; and
a multiplexer, configured to receive the fifth shift signal at a non-inverting input, receive the first shift signal at an inverting input, and receive the control signal at a selection input.

14. The electronic circuit of claim 10, wherein the first feature corresponds to a phase variation of the second signal, and the second feature corresponds to a period variation of the second signal.

15. The electronic circuit of claim 14, wherein the first feature is calculated by performing a root mean square (RMS) calculation on an amplitude of the second signal.

16. The electronic circuit of claim 14, wherein the parameter generator is configured to provide a third feature by performing an (RMS) calculation on an amplitude of a difference between the second signal and another second signal successive to the second signal, and the second feature is calculated by dividing the third feature with a square root of a frequency factor of the electronic circuit.

17. The electronic circuit of claim 9, wherein the parameter generator is further configured to continuously process the second signal until a minimum of the first feature or the second feature is obtained.

18. A method for operating an electronic circuit, comprising:
receiving a first signal by a digital filter;
generating a second signal through filtering the first signal by the digital filter; and
receiving the second signal, by a parameter generator, to generate a first parameter and a second parameter, wherein the operation of generating the first parameter and the second parameter further comprises:
providing, by the parameter generator, a first feature and a second feature associated with the second signal; and
generating the first parameter and the second parameter in response to the first feature or the second feature.

19. The method of claim 18, further comprising:
maintaining the first parameter and changing the second parameter until obtaining a minimum of the first feature or the second feature.

20. The method of claim 19, further comprising:
changing the first parameter and maintaining the second parameter until obtaining the minimum of the first feature or the second feature.

* * * * *